United States Patent [19]
Martin

[11] 4,308,417
[45] Dec. 29, 1981

[54] ELECTRICAL SEALING DEVICE

[75] Inventor: Sidney H. Martin, Stockport, England

[73] Assignee: International Computers Limited, London, England

[21] Appl. No.: 157,488

[22] Filed: Jun. 9, 1980

[30] Foreign Application Priority Data

Jun. 19, 1979 [GB] United Kingdom ............... 21269/79
Jun. 19, 1979 [GB] United Kingdom ............... 21270/79

[51] Int. Cl.³ .............................................. H05K 9/00
[52] U.S. Cl. ....................... 174/35 GC; 219/10.55 D; 361/424
[58] Field of Search .......... 174/35 R, 35 GC, 35 MS; 361/424; 219/10.55 D

[56] References Cited
U.S. PATENT DOCUMENTS 2,905,924 9/1959 Peterson ..................... 339/275 R X

FOREIGN PATENT DOCUMENTS 457574 8/1968 Switzerland ......................... 174/99

OTHER PUBLICATIONS

Evans et al., *Compliant EMC Shield for Movable Covers*, IBM Technical Disclosure Bulletin, vol. 22, No. 8A, pp. 3308, 3309, Jan. 1980.

Primary Examiner—Gene Z. Rubinson
Assistant Examiner—D. A. Tone
Attorney, Agent, or Firm—Lee, Smith & Jager

[57] ABSTRACT

An electrical sealing device consisting of a brush-like element comprising a plurality of flexible filaments (1) the majority of which are electrically conductive and are distributed substantially uniformly among the insulating filaments. The device can be used, for example, for electrically sealing around the edge of a door (6) of an equipment enclosure (5) so as to prevent electromagnetic interference from leaking into or out of the enclosure, or can be used for electrically sealing an aperture (9) through which wires (10) may pass.

9 Claims, 3 Drawing Figures

ELECTRICAL SEALING DEVICE

BACKGROUND TO THE INVENTION

This invention relates to electrical sealing devices, for reducing electromagnetic interference.

It is often necessary to provide an enclosure for electronic equipment which shields the equipment against externally generated electromagnetic interference. Alternatively, the enclosure may be necessary to prevent signals generated by the equipment from interfering with other equipment.

It is usually necessary to provide some door or cover plate for the enclosure, so as to allow access to the equipment. However, it is difficult to ensure good, uniform electrical contact between the door or cover plate and the surrounding part of the enclosure. Accordingly, there is a tendency for signal leakage to occur.

It has been suggested to use conductive gaskets for improving the electrical sealing between a door or cover plate and the enclosure. One form of gasket consists of a multiplicity of wire elements embedded in an insulating resilient material. Examples of such gaskets are described in British Patent Specification No. 751496 and U.S. Pat. No. 2,885,459. A second form of gasket consists of metallic particles distributed throughout an insulating resilient material, as described in U.S. Pat. No. 3,583,930. When a slab of the material is compressed, the particles provide a path of relatively low conductivity between opposite faces. Both forms of the gasket have a substantial mechanical stiffness, so that a large force is required to provide the required compression of the gasket round the edges of a large door or panel. Apart from the difficulties which may be experienced by a service engineer, for example, in closing the door, or replacing the panel, the force may be sufficient to cause distortion of hinges, catches, or of the door or panel itself.

One object of the present invention is therefore to provide an electrical sealing device which requires considerably smaller compressive forces than the gaskets referred to above.

Another problem which arises with such equipment is that it is often necessary to provide a hole in the wall of the enclosure for wiring to pass through, and such a hole may allow electromagnetic interference to pass into or out of the enclosure. In order to minimize such interference, the hole is usually made of just sufficient size to accept the wiring. Sometimes the shielding braid on the wiring is held in a clamp around the periphery of the hole. This can, however, lead to difficulties in the initial fitting or replacement of the wiring, particularly if the wiring consists of one or more relatively thick and stiff cables.

Another object of the present invention is therefore to provide an electrical sealing device which can electrically seal a hole through which wiring passes, in such a way as to permit easy removal or replacement of the wiring.

SUMMARY OF THE INVENTION

According to a first aspect of the invention, an electrical sealing device comprises a strip-like conductive holder and a plurality of flexible filaments mounted in the holder and extending outward therefrom, the majority of the filaments being electrically insulating and the remainder of the filaments being electrically conductive, the conductive filaments being distributed substantially uniformly among the insulating filaments and being in conductive contact with the holder.

According to a second aspect of the invention, there is provided an enclosure for electrical equipment, the enclosure having an aperture, and an electrical sealing device for reducing the passage of electromagnetic interference through the aperture, the sealing device comprising a plurality of flexible filaments of which a majority are electrically insulating and the remainder are electrically conductive, the conductive filaments being distributed substantially uniformly among the insulating filaments.

BRIEF DESCRIPTION OF THE DRAWINGS

Embodiments of the invention will now be described by way of example with reference to the accompanying drawings of which.

DESCRIPTION OF THE PREFERRED EMBODIMENTS

Figure 1:
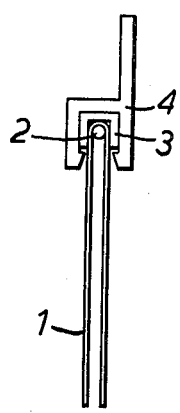
FIG. 1 shows an electrical sealing device in accordance with the invention.

Referring to FIG. 1, the electrical sealing device consists of a linear brush-like element comprising a plurality of flexible filaments 1. The majority of the filaments are electrically insulating and may consist, for example, of nylon fibres. The remaining filaments are electrically conducting and may consist, for example, of brass wires. The conducting filaments are distributed substantially uniformly among the insulating filaments. Other materials may be used for the filaments, provided they have suitable stiffness. It will be appreciated that the mechanical properties of the filaments can also be varied by changing their diameter or length. Metal filaments can also be crimped to alter their effective stiffness.

The filaments 1 are folded in half around a conductive rod 2 which is positioned in a conductive U-shaped channel member 3. The channel member is crimped or compressed to hold the rod 2 and filaments 1 securely within it. This method of mounting ensures that most, if not all, of the conductive filaments are held in electrical contact with the channel member or the rod.

The channel member 3 is mounted in a strip member 4, which has a channel formed along one edge to receive the channel member 3.

The rod 2, channel member 3 and strip member 4 may be made of aluminium for example.

Figure 2:
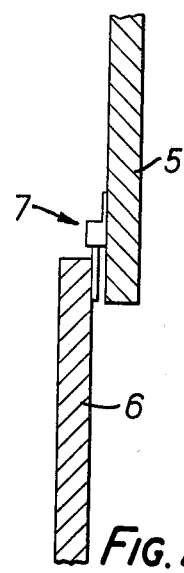
FIG. 2 shows the use of such a device for electrically sealing a door of an enclosure.

Referring now to FIG. 2, this shows part of the wall of an enclosure 5 for holding electronic equipment. The enclosure has a door 6 allowing access to the interior of the enclosure. As shown, when the door is closed, it abuts against the wall of the enclosure 5. However, because of irregularities in the door and wall, there will inevitably be small gaps or apertures between the door 6 and the wall, through which electromagnetic interference may leak.

This interference can be reduced by positioning an electrical sealing device 7, of the kind shown in FIG. 1, on the wall of the enclosure around the edge of the door 6. The strip member 4 of the device is fastened to the wall, and is in electrical contact with the enclosure. The sealing device 7 is so positioned that it is lightly compressed when the door 6 is closed. Thus, the conductive filaments will be held in electrical contact with the door.

In this use of the sealing device, the filaments 1 are typically 5 cm. in length, so that when folded in half, they provide a brush-like element 2.5 cm in depth. The diameter of the filaments may typically be about 0.01 cm.

The number of conductive filaments per unit length of the sealing device is a compromise which may be evaluated by experiment. In the described example, the conductive filaments are stiffer than the non-conductive filaments, so that, if there are too many of them, the sealing device requires a compression force which is too large. On the other hand, the shielding efficiency is reduced if the number of conductive filaments is very small.

Accordingly, the optimum number of conductive filaments is a function of such factors as the expected size of the gap which is to be sealed, and the level of signal reduction which is necessary. Tests have shown that the percentage of conductive filaments may be between about 10% and 50% depending upon the particular operational needs.

Figure 3:
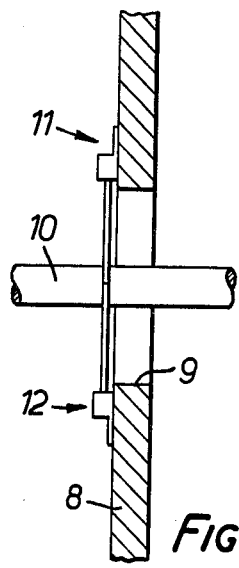
FIG. 3 shows the use of such a device for electrically sealing a hole allowing wiring to pass into an enclosure.

Referring now to FIG. 3, this shows part of the wall of an enclosure 8 holding electronic equipment. The enclosure has a hole 9 in its wall, allowing wiring 10 to pass into the enclosure. A pair of sealing devices 11 and 12, of the kind described above with reference to FIG. 1, are mounted on the wall of the enclosure, on opposite sides of the hole 9, so that their filaments 1 extend across and cover the hole, the ends of the filaments from the two devices being intermingled. The strip members 4 of the two devices are fastened to the wall and are thus in electrical contact with the enclosure.

It can be seen that the wiring 10 can be readily passed through the hole 9, the filaments 1 being sufficiently flexible to allow the wiring to be threaded through them.

In this use of the sealing device, the filaments 1 are typically longer than in the application of FIG. 2. For example, they may be 20 cm in length, so that when folded in half they provide a brush-like element 10 cm in depth. Moreover, in this case, the insulating filaments are typically thicker e.g. 0.05 cm in diameter, so as to provide more stiffness.

In a modification of the arrangement shown in FIG. 3, the hole 9 may be circular, and may be electrically sealed by one or more sealing devices similar to that shown in FIG. 1, but formed into a ring or curve to conform with the periphery of the hole.

It will be apparent that a sealing device in accordance with the invention may be used in a variety of applications, such as around doors, in rack and panel mountings, between adjacent panels of an enclosure, etc.

I claim:

1. An electrical sealing device comprising a strip-like conductive holder and a plurality of flexible filaments mounted in the holder and extending outward therefrom, the majority of the filaments being electrically insulating and the remainder of the filaments being electrically conductive, the conductive filaments being distributed substantially uniformly among the insulating filaments and being in conductive contact with the holder.

2. A device according to claim 1 wherein said filaments are folded in half around a conductive rod member, which is placed in a conductive channel member and the channel member compressed so as to hold the rod and filaments securely within it.

3. A device according to claim 1 wherein said electrically insulating filaments are nylon fibres.

4. A device according to claim 1 wherein said electrically conductive filaments are metal wires.

5. A device according to claim 1 wherein the proportion of electrically conductive filaments is in the range 10%-50%.

6. An enclosure for electrical equipment, the enclosure having an aperture, and an electrical sealing device for reducing the passage of electromagnetic interference through the aperture, the sealing device comprising a plurality of flexible filaments of which a majority are electrically insulating and the remainder are electrically conductive, the conductive filaments being distributed substantially uniformly among the insulating fibres.

7. An enclosure according to claim 6, having a portion which is movable relative to the main part of the enclosure to allow access to the interior thereof, wherein said aperture lies between the edge of said movable portion and the main part of the enclosure.

8. An enclosure according to claim 6, wherein said aperture is sufficiently large to allow electrical wiring to pass into the enclosure, between the filaments of said sealing device.

9. An enclosure according to claim 8, having two of said sealing devices mounted on opposite sides of said aperture with their filaments extending towards each other and intermingling with each other.

* * * * *